United States Patent [19]
Ward

[11] Patent Number: 5,410,504
[45] Date of Patent: Apr. 25, 1995

[54] MEMORY BASED ON ARRAYS OF CAPACITORS

[76] Inventor: Calvin B. Ward, 9580 Crow Canyon Rd., Castro Valley, Calif. 94546

[21] Appl. No.: 237,269
[22] Filed: May 3, 1994
[51] Int. Cl.$^6$ ............................................. G11C 11/24
[52] U.S. Cl. .................................. 365/149; 365/189.01
[58] Field of Search .................... 365/149, 150, 230.01, 365/189.01

[56] References Cited

U.S. PATENT DOCUMENTS

| | | | |
|---|---|---|---|
| 2,924,970 | 2/1960 | Samsez | 365/149 |
| 3,098,996 | 7/1963 | Kretzmer | 365/149 |
| 3,118,133 | 1/1964 | Meeker et al. | 365/149 |
| 3,350,691 | 10/1967 | Faulis | 365/149 |

Primary Examiner—Terrell W. Fears
Attorney, Agent, or Firm—McCubbrey, Bartels & Ward

[57] ABSTRACT

A memory constructed from a plurality of capacitor elements organized into a two-dimensional array having a plurality of rows and columns. Each capacitor element includes a bottom electrode, a top electrode, and a dielectric layer disposed between the top and bottom electrodes, all of the bottom electrodes in each column being connected together to form a column electrode and all of the top electrodes in each row being connected together to form a row electrode. The memory is read by generating an electrical signal on one of the row electrodes while connecting the remaining row electrodes to a reference potential and sensing the current generated in one of the column electrodes. The capacitance of the capacitor elements corresponds to data values stored in the memory. Different capacitor values may be constructed by altering the area of the top electrodes or altering the dielectric constant of the dielectric layer between the corresponding top and bottom electrodes. The area of the top electrodes may be set to a first value during fabrication and then altered after fabrication of the basic structure. In this manner, a write-once-read-many (WORM) memory may be implemented.

8 Claims, 9 Drawing Sheets

MEMORY BASED ON ARRAYS OF CAPACITORS

FIELD OF THE INVENTION

The present invention relates to storage devices, and more particularly, to a high density, large scale storage system for use in data processing systems.

BACKGROUND OF THE INVENTION

While there have been substantial improvements in disk drive technology, the capacity and speed of disk drives is still far below that needed to provide on line access to large specialized libraries or databases. To store a library, such as all of the issued patents in the United States, requires a storage system capable of holding roughly a million megabytes (terabyte) of storage. A large law library would require a similar amount of storage.

Magnetic disks have access times of the order of ten milliseconds and capacities of less than 100 megabytes per surface. The cost of magnetic storage is about $1 a megabyte. Hence, a terabyte of storage can be provided only in systems with a very large number of users or a very high value database.

Optical disks provide improved data density and cost, but have significantly poorer performance than magnetic disk drives. A single-sided CD-ROM platter can provide 500 megabytes of storage at a cost of few dollars. Such systems are well suited to library applications in which the information stored thereon is not likely to change. Unfortunately, the access times are of the order of a 100 milliseconds and the data transfer rates are typically less than a megabyte per second. In addition to the cost of the platter, one must take into account the cost of the disk drive in assessing the total storage cost. Single platter disk drives have costs of the order of a few hundreds of dollars. If more than one platter is to be on-line at any given time, the user must either install multiple drives or purchase a disk changer. Hence, the actual cost of on-line storage is actually greater than $0.50 per megabyte. If a changer is used, the performance is also substantially reduced if access to several disks is required, since one must wait for the changer to unload the current platter and then load the next platter.

Broadly, it is the object of the present invention to provide an improved data storage system for use on data processing systems.

It is a further object of the present invention to provide a data storage system that has data densities of the order of those achievable with optical disk drives, but with improved access time.

It is a still further object of the present invention to provide a data storage system with a capacity much greater than that achievable on a single CD-ROM without requiring multiple disk drives or slow platter changers.

These and other objects of the present invention will become apparent to those skilled in the art from the following detailed description of the invention and the accompanying drawings.

SUMMARY OF THE INVENTION

The present invention is a memory constructed from a plurality of capacitor elements organized into a two-dimensional array having a plurality of rows and columns. Each capacitor element includes a bottom electrode, a top electrode, and a dielectric layer disposed between the top and bottom electrodes, all of the bottom electrodes in each column being connected together to form a column electrode and all of the top electrodes in each row being connected together to form a row electrode. The dielectric layer may be a common layer shared by all of the capacitors. The memory is read by generating an electrical signal on one of the row electrodes while connecting the remaining row electrodes to a reference potential and sensing the current generated in one of the column electrodes. The capacitance of the capacitor elements corresponds to data values stored in the memory. Different capacitor values may be implemented by altering the area of one of the electrodes or altering the dielectric constant of the dielectric layer between the corresponding top and bottom electrodes. The area of the top electrodes may be set to a first value during fabrication and then altered after fabrication of the basic structure. In this manner, a write-once-read-many (WORM) memory may be implemented.

DETAILED DESCRIPTION OF THE INVENTION

The present invention is a cross-point capacitor array for storing information. The array may be used as a ROM or as a WORM. While the array can be constructed on silicon or other semiconductor substrates to provide active circuitry for use in conjunction with the array, the array does not require silicon or other semiconductor substrates. Hence, its size and cost is not limited by the constraints of semiconductor manufacturing techniques. Using conventional fabrication techniques, data densities of the order of those achievable with CD-ROMs may be obtained. Furthermore, a plurality of memory planes may be packed into a three-dimensional array in which all of the memory planes are on-line at the same time and may be read without incurring seek times or slow data rates.

Figure 1:
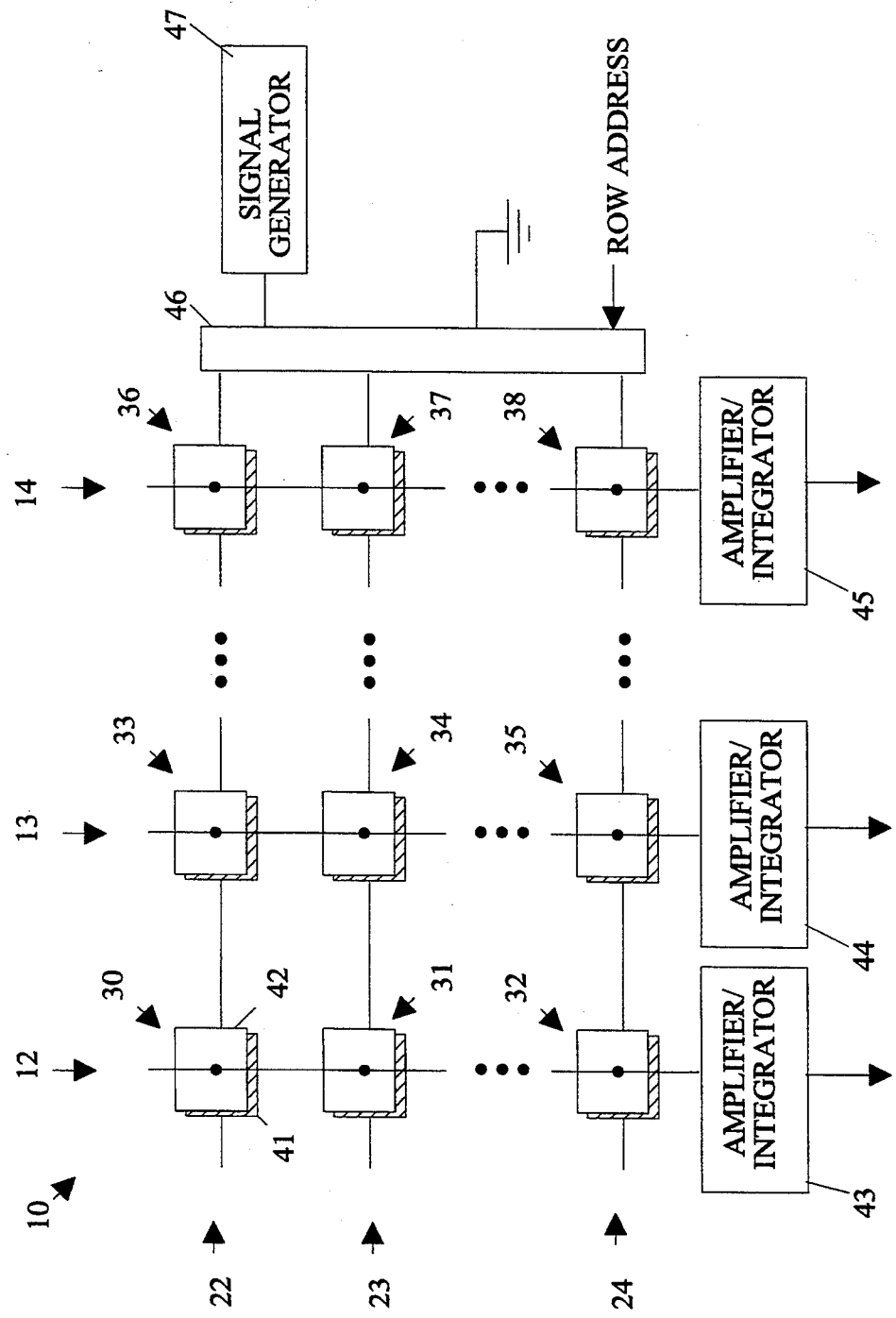
FIG. 1 is a block diagram of a memory 10 according to the present invention.

FIG. 1 is a block diagram of a memory 10 according to the present invention. Memory 10 includes a capacitor array comprising a plurality of capacitors having top and bottom plates. Exemplary capacitors are shown at 30–36. The top plates are connected to form a plurality of columns of which columns 12–14 are exemplary, and the bottom plates are connected to form a plurality of rows of which rows 22–24 are exemplary. In the preferred embodiment of the present invention, each capacitor is used to store one bit of information, a capacitor storing a "1" having a different capacitance than a capacitor storing a "0". The capacitance of any particular capacitor in the array may be determined by placing a pulse on the row of bottom plates in which the capacitor is located and detecting the charge displaced along the column of top plates in which the capacitor is located. This is accomplished by connecting the row in question to a pulse line using selector 47 while grounding all other row lines using circuit 46. In the embodiment shown in FIG. 1, all of the capacitors in the row connected to the signal generator are read out in parallel. Each capacitor is read out by detecting the current displaced by the pulse on the corresponding column. Each column includes an amplifier/integrator circuit for this purpose. Exemplary amplifier/integrator circuits are shown at 43–45.

The time before data can be read-out will depend on the time constants of the amplifier/integrator circuits and the sizes of the capacitances. However, read-out times of less than a few microseconds are obtainable with conventional amplifiers and capacitance values. It should be noted that the read-out of all bits in a row may be done in parallel; hence, arbitrarily high data rates can be achieved by increasing the number of bits read-out at once, i.e., by increasing the number of columns in the memory.

Consider the case in which a pulse is applied to row 22 via signal generator 47. During the pulse, all other rows are connected to ground. The application of the pulse to the capacitors in row 22 will cause charge to be displaced from the upper plates of the capacitors in row 22. The amount of charge displaced is related to the capacitance of the capacitor. As noted above, capacitors storing ones have capacitances which are different from capacitors that store zeros.

Figure 2:
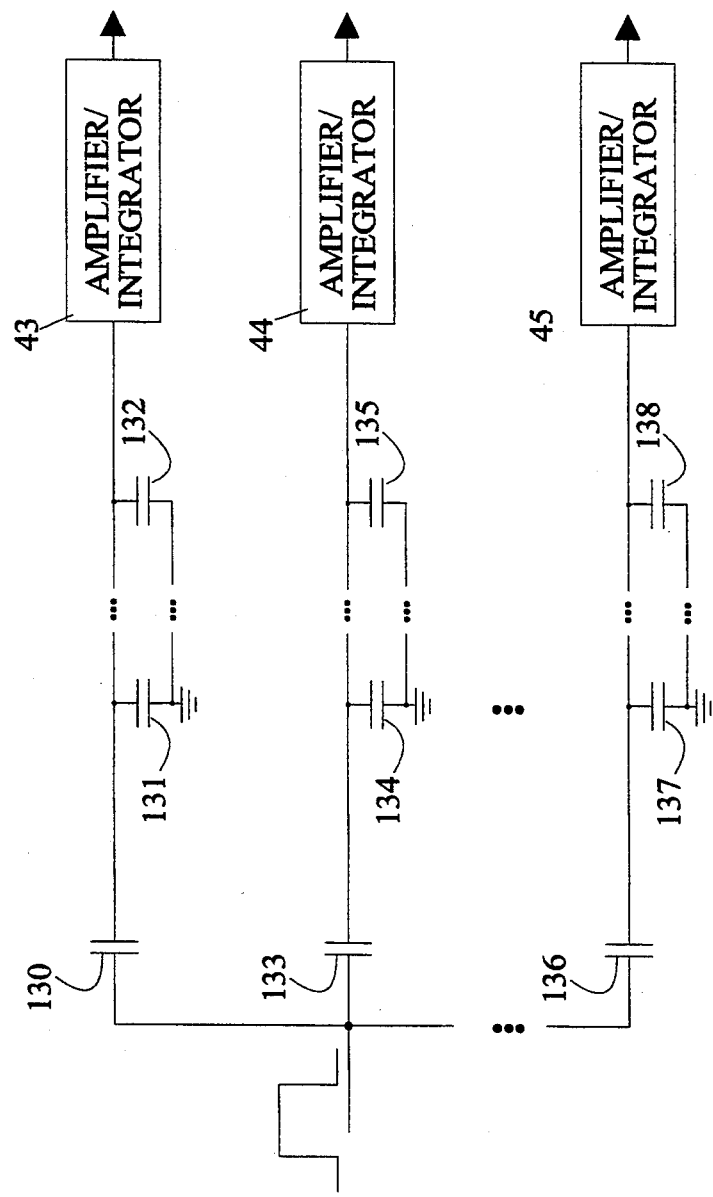
FIG. 2 is a schematic drawing of the equivalent circuit of the capacitor array when a pulse is applied to row 22 while holding all other rows at ground.

The displaced charge will either be stored on the remaining capacitors in each column or enter the amplifier/integrator at the end of the column since these are the only possible locations at which the charge can exit from each column. Refer now to FIG. 2 which is a schematic drawing of the equivalent circuit for the capacitor array when a pulse is applied to row 22 while holding all other rows at ground. The capacitors that are equivalent to each capacitor element have been numbered with a number that is 100 greater than the number of the corresponding capacitor in FIG. 1. The amount of charge that may be stored on any of the capacitors having one plate thereof connected to ground is proportional to the voltage drop across the capacitor. The voltage drop in question is equal to the voltage at the input to each of the amplifier/integrator circuits. Hence, if the amplifier/integrator circuits are chosen such that they maintain an input potential at ground, no charge will be stored on the other capacitors in each column. In this case, the charge measured by the amplifier/integrator circuit will be that displaced from the pulsed capacitor independent of the capacitances of the remaining capacitors in the column. Hence, the present invention does not require the use of isolation transistors to prevent cross-talk between the storage elements as is the case in normal semiconductor memories.

Figure 3:
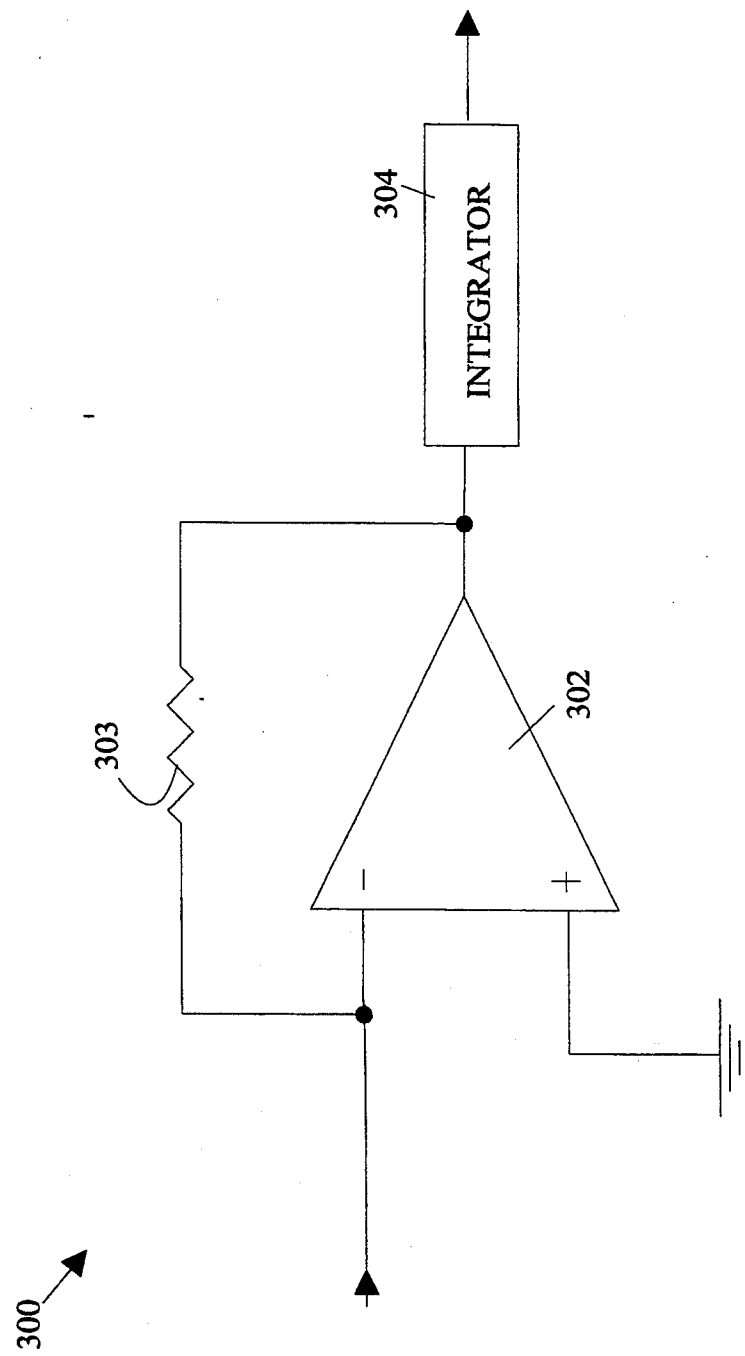
FIG. 3 is an amplifier/integrator circuit for use in the present invention.

Current-to-voltage amplifier circuits are well known to the electronic arts. Such circuits have effective input impedances of zero. The preferred embodiment of an amplifier/integrator circuit for use in the present invention is shown in FIG. 3 at 300. The amplifier section is constructed from an operational amplifier 302 having its non-inverting input tied to ground. When a current pulse is received on the inverting input, the amplifier output moves to cause an equal, but opposite current to flow into the inverting node via resistor 303, effectively holding the inverting node at ground. The output of amplifier is fed to an integration circuit 304 whose output may be used to determine the capacitance of the capacitor being measured. Integrators are well known to the electronic arts, and hence, will not be discussed in more detail here.

Figure 4:
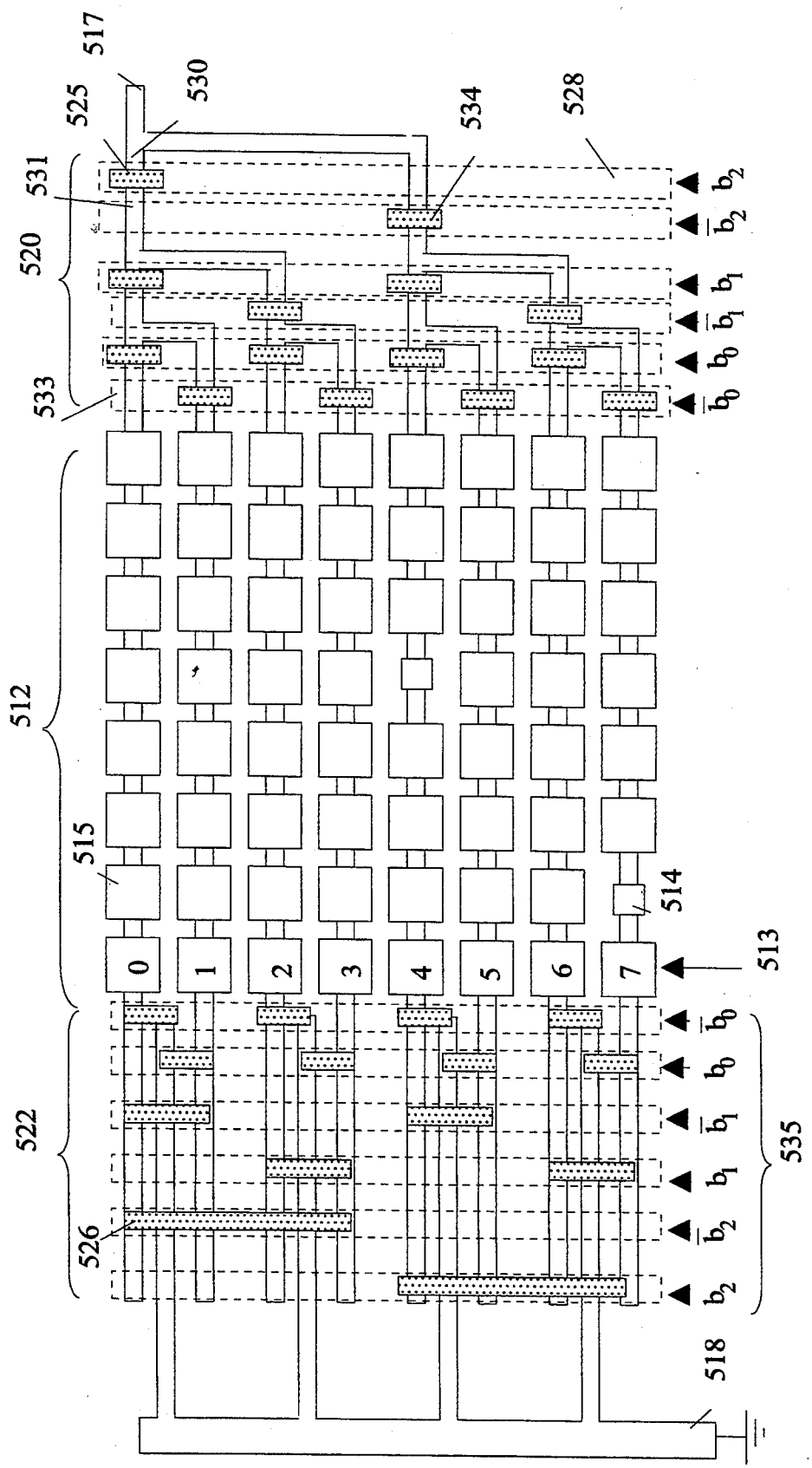
FIG. 4 is a block diagram of the bottom plates of an exemplary 8×8 capacitor array according to the present invention.

The above-described embodiments of the present invention require circuitry for grounding all rows but one while applying a pulse to the selected row. The manner in which this can be accomplished may be more easily understood with reference to FIG. 4 which illustrates the bottom plates of an exemplary $8 \times 8$ capacitor array is shown at 512. Any given capacitor in array 512 has a plate whose size is determined by the data being stored therein. A plate of a capacitor storing the value 1 is shown at 515 and one storing the value 0 is stored at 514. The plates are organized into a plurality of rows. Each row is assigned an address. The addresses of the rows are shown at 513. Any given row address may be specified by a three-bit address code. Denote the bits of the address code by $b_0$, $b_1$, and $b_2$. The complements of these addresses are denoted by $\bar{b}_0$, $\bar{b}_1$, and $\bar{b}_2$, respectively.

The selection circuitry is divided into two sections shown at 520 and 522, respectively. The circuitry shown at 520 will be referred to as the select one circuitry. That shown at 522 will be referred to as the "ground the rest" circuitry. These two sections operate in cooperation to connect the row specified by the row address to conductor 517 while connecting all other rows to a ground bus 518.

The manner in which the select one circuit 520 operates will now be explained in more detail. Circuit 520 includes a plurality of switching regions of which region 525 is typical. These regions may be viewed as breaks in the conductors in which they are located. Hence, region 525 provides a break between conductors 530 and 531. The breaks may be closed by application of a control signal to the region. The switching regions are organized into a plurality of columns. For example, column 528 contains switch region 525. The number of switching regions in each column differs for different columns. Hence, column 533 contains 4 switching regions; while, column 528 includes only one switching region. All of the switching regions in a given column are controlled by the same control signal. The control signals in question are either the bits of the row address or the complements thereof. Hence, column 528 is controlled by the most significant bit of the row address, and column 533 is controlled by the complement of the least significant bit of the control address. Hence, when 1 is the most significant bit of the row address and is applied to the circuitry, switch 525 will close, and switch 534 will be open. It will be apparent to those skilled in the art that circuit 520 connects precisely one row line to conductor 517.

As indicated above, circuit 522 connects the remaining row lines to ground bus 18. This is accomplished using shorting switches such as shown at 526. Each shorting switch is either a conductor or an insulator depending on the state of a control signal. The shorting switches are likewise organized into columns in which each column is controlled by a bit of the row address or the complement thereof. The control signal assignments for the various columns are shown at 35. Consider the case in which row 5 is connected to conductor 517. Control signals $\bar{b}_0$, $\bar{b}_1$, and $\bar{b}_2$, will be true and all other signals will be false. The first of these signals causes rows 0, 2, 4, and 6 to be connected to ground bus 518. The second signal causes rows 6, 7, 2, and 3 to be connected to ground bus 518. The third signal causes rows 0, 1, 2, and 3 to be connected to ground bus 0. Hence, every row except row 5 is connected to ground bus 18 by at least one shorting switch.

The only active circuitry in the above-described selection circuits is the control switches used to implement circuits 520 and 522. These control switches can be constructed from any material that can be switched from an insulator to a conductor in response to a control signal. If the array is constructed on a semiconductor wafer, the switching regions may be constructed as FET's or circuits analogous thereto.

The switching regions may also be constructed by depositing a photo-conducting material. In the case of switches such as switch 525, the material is deposited in a break in the conductor. In the case of switches such as 526, the material is deposited between the conductors and the ground bus. The individual switching regions that are to be controlled by a given signal are organized into linear arrays. Hence, a single line source may be used to switch all of the switching elements in any given column in response to the control signal corresponding to the column. Control elements that do not require photo-conductors will be discussed in more detail below.

In the embodiment shown in FIG. 1, a separate sense amplifier was provided for each column. This arrangement provides the highest rate of data output; however, it requires a separate amplifier/integrator for each column. If the capacitors are closely packed, there may not be sufficient space to provide one amplifier for each column. In this case, a single amplifier/integrator may be shared by a plurality of columns by using a selection circuit analogous to that shown in FIG. 4 to select one of the columns for read out while grounding the remaining columns to minimize cross-talk.

In the embodiments discussed above, the differences in capacitances between the capacitors storing ones and those storing zeros were realized by using plates having different areas. In the preferred embodiment of the present invention, only one of the plates of each capacitor needs to be of a different size to distinguish capacitors corresponding to ones from those corresponding to zeros. The reason for changing the area of only one of the plates may be more easily understood with reference to the manner in which a capacitor array according to the present invention is preferably constructed.

Figure 5:
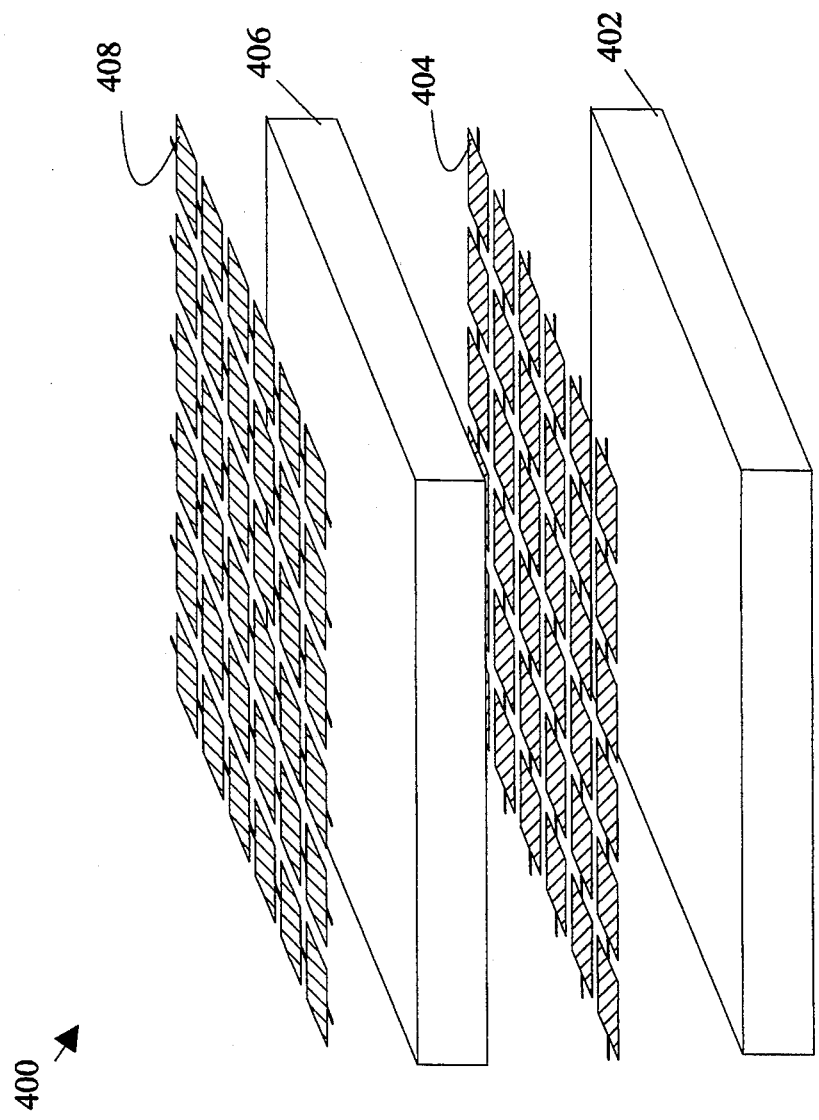
FIG. 5 illustrates the construction of a capacitor array according to the present invention.

Refer now to FIG. 5 which illustrates the construction of a capacitor array 400 according to the present invention. Capacitor array 400 is preferably constructed on a substrate 402. If a silicon substrate is used, the amplifier/integrator circuitry may be fabricated on the same substrate by conventional integrated circuit fabrication techniques. The bottom electrodes of the capacitors are constructed on substrate 402 by depositing a platinum layer 404 which is patterned as connected rows of electrodes. The bottom electrodes 404 are preferably attached to substrate 402 with the aid of a $TiO_2$ "glue" layer which prevents separation of the bottom electrode layer from substrate 402 during later processing steps that involve substantial heating of substrate 402 and bottom electrode layer 404. The glue layer is generated by evaporating 150 Å of pure metallic titanium onto the substrate 402. The titanium layer is then annealed at 650° C. for 0.5 hours to fully oxidize the titanium, thereby creating $TiO_2$. A 1000 Å layer of platinum is then deposited on $TiO_2$ layer by evaporation. The platinum is annealed at 650° C. for 1 hour. The annealing step promotes adhesion between the metal oxide and the platinum. The platinum layer is then masked and etched with aqua regia to form bottom electrode layer 404.

A dielectric layer 406 is then deposited on bottom electrode layer 404. In the preferred embodiment of the present invention, dielectric layer is constructed from a ferroelectric material such as lead zirconate titanate (PZT). This material has a very high dielectric constant. The large dielectric constant increases the amount of charge available to the amplifier/integrators.

The preferred method of deposition of the dielectric layer is the conventional sol gel deposition technique. In this technique, a solution of the PLZT material is spun onto the substrate to be coated. The solution consists of a solvent carrying a metal organic complex which has been partially gelled into long chains. The chains consist of a linear array of metal atoms alternating with oxygen atoms and coordinated with hydrocarbon groups along the outside of the linear array. The chains are normally formed by hydrolysis of alkoxides which are individual metal atoms bonded to the hydrocarbons. The alkoxides are mixed to produce the desired ratio of metal atoms in the final ceramic and then water is added to the mixture. The water hydrolyzes the individual alkoxide molecules into the chains which remain suspended in the solvent. In this way, metal oxide molecules are dissolved in solvents such as simple alcohols.

The sol gel is spun onto the substrate using a conventional spinning apparatus. The solvent evaporates during the spinning, leaving the surface of the substrate coated with metal organic chains. The substrate is then heated gradually to evaporate the remaining solvent. After the solvent has been evaporated, the coated substrate is heated further to break the hydrocarbon bonds. As a result, hydrogen, carbon and oxygen are released, leaving a coating of metals and oxygen. The substrate is then raised to a temperature which sinters the amorphous layer into its ceramic form. For PZT, the hydrocarbons evaporate below 400° C.

Finally, a metallic layer 408 comprising the top electrodes of the capacitors is deposited on dielectric layer 406. The capacitors in this layer are patterned as connected columns of electrodes. The electrodes are preferably constructed from platinum for compatibility with the PZT material.

As noted above, the bottom plates of the capacitors are all preferably the same size. The size is that of the maximum plate size. If this condition is met, the actual programming of the array can be accomplished by adjusting the size of the top plates of the capacitors. For example, to store a one, a plate that is the same size as the corresponding bottom plate would be used. To store a zero, a plate that is much smaller than the corresponding bottom plate would be used.

The top plates may be directly patterned to correspond to the stored data or they may be initially patterned to the maximum size. In the later case, the array initially stores all ones. Any particular bit can then be set to a zero by removing part of the top plate of the corresponding capacitor. In the case of a ROM, all of the top plate sizes can be adjusted simultaneously using a mask directed etch.

Figure 6:
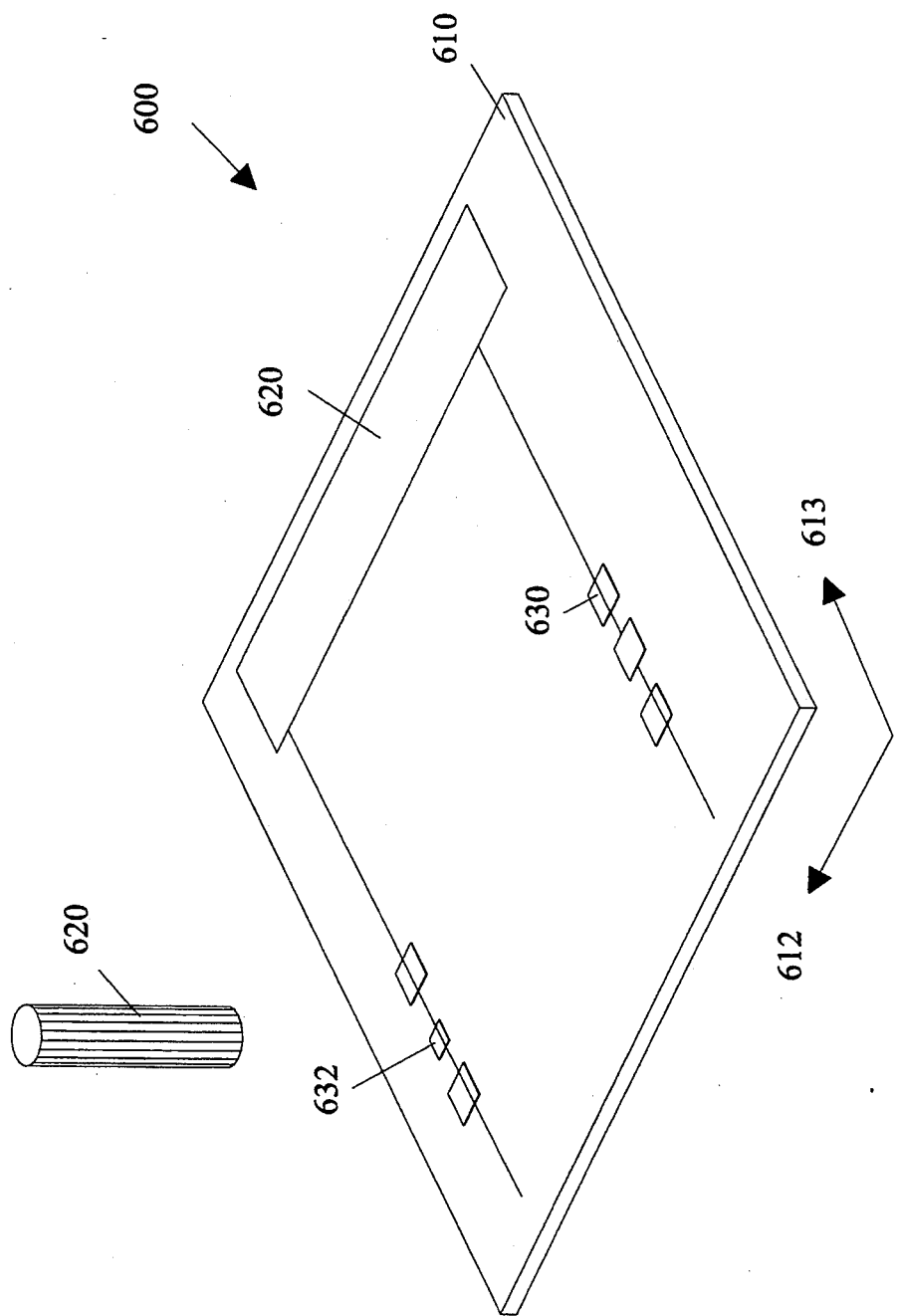
FIG. 6 is prospective view of a single memory plate in a WORM configuration.

The present invention may also be implemented in as a WORM memory. A WORM memory according to the present invention may be implemented as one or more memory planes. Each memory plane has one capacitor array of the type described above. For the purposes of the present discussion, it will be assumed that each plane also has its own read circuitry which selects a row in response to an address and returns the value(s) stored on one or more capacitors having plates in the row in question. A block diagram of a system having one memory plane 610 is shown at 600 in FIG. 6. The read circuitry is shown at 620. Memory plane 610 may be positioned under a laser 620 by moving memory plane 610 relative to laser 620 as indicated at 612 and 613. This can be accomplished by conventional mechanical means or by providing laser 620 with a deflection system that allows laser 620 to direct its beam to any point on the surface of memory plane 610. A plate corresponding to a one may be altered to a size corresponding to a zero by ablating a portion of the plate. An ablated plate is shown at 632, an exemplary unabated plate being shown at 630.

Since memory 600 includes read circuitry, the portion of the memory plane that has already been written may be read at any time. It should be noted that the read operation does not require the laser; hence, the read can be carried out without incurring the seek time normally encountered in optical memories. Furthermore, a given bit may be read immediately after being programmed with the laser to verify that the bit was properly written.

When all of the available space on memory plane 610 has been written, the memory plane may be placed in a separate read apparatus to provide read only access to the contents thereof. Since reading does not require physical access or movement of the memory plane, the read apparatus can be a closely packed stack of memory planes. Such an arrangement provides an essentially three-dimensional memory array which is capable of storing $10^{12}$ bytes of information in less than a cubic meter.

Figure 7:
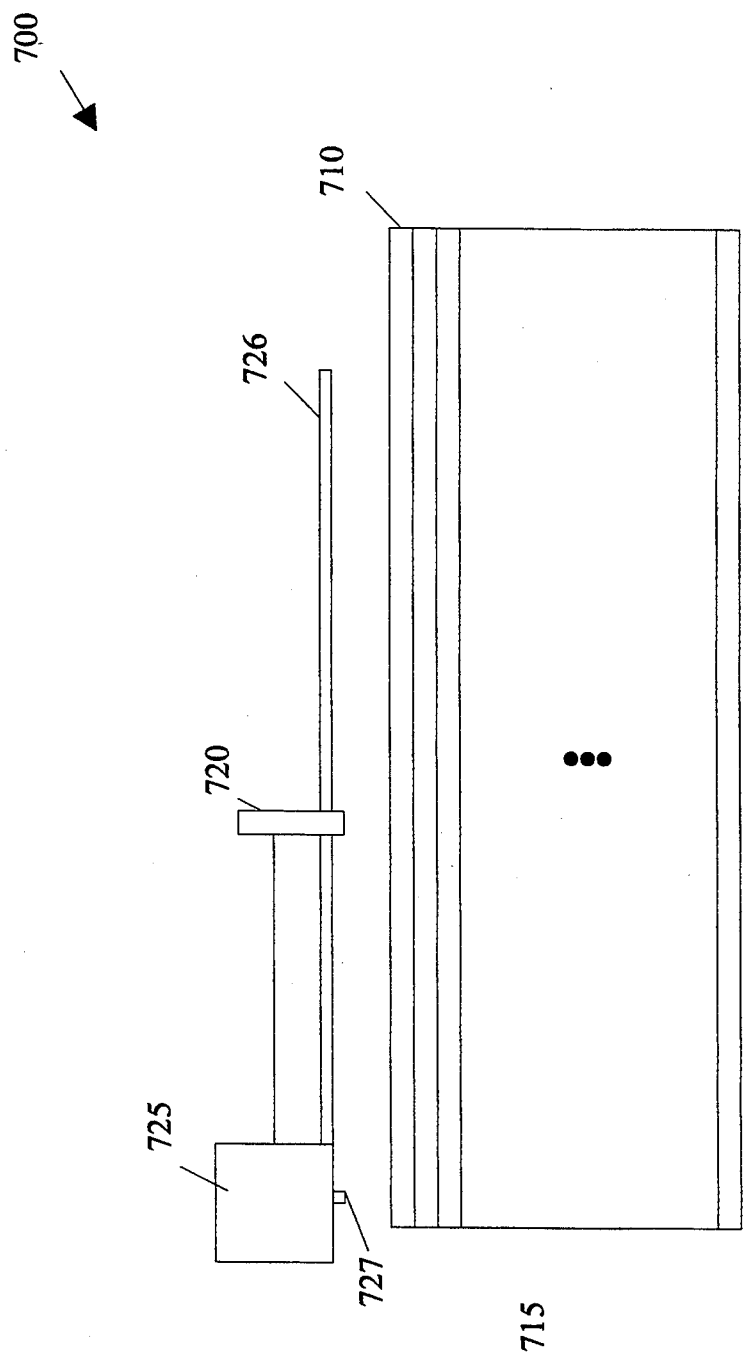
FIG. 7 is a side view of a memory system according to the present invention with multiple memory plates.

In the preferred embodiment of a WORM memory system according to the present invention, the write station with its laser occupies the top most position in the stack as shown in FIG. 7. FIG. 7 is a side view of a multi-plane memory 700 according to the present invention. Memory 700 includes a plurality of slots 715. Each slot may be used to access one memory plate according to the present invention. Each slot includes connectors for accessing the addressing circuitry on the memory plane plugged into the slot. The top most slot 710 in the stack is accessible to laser 725 which may be moved via actuator 725 along track 726. Actuator 725 and track 726 move on track 727 so as to provide access to any capacitor in the memory plane in slot 710.

When the memory plane in slot 710 is completely written, it is removed and placed in one of the lower memory slots. A new memory plane is then placed in slot 710. In this manner, a large amount of information can be written and then maintained on-line. If the ability to write the memory planes in place is not needed, the top station with its laser and positioning system may be omitted.

Figure 8:
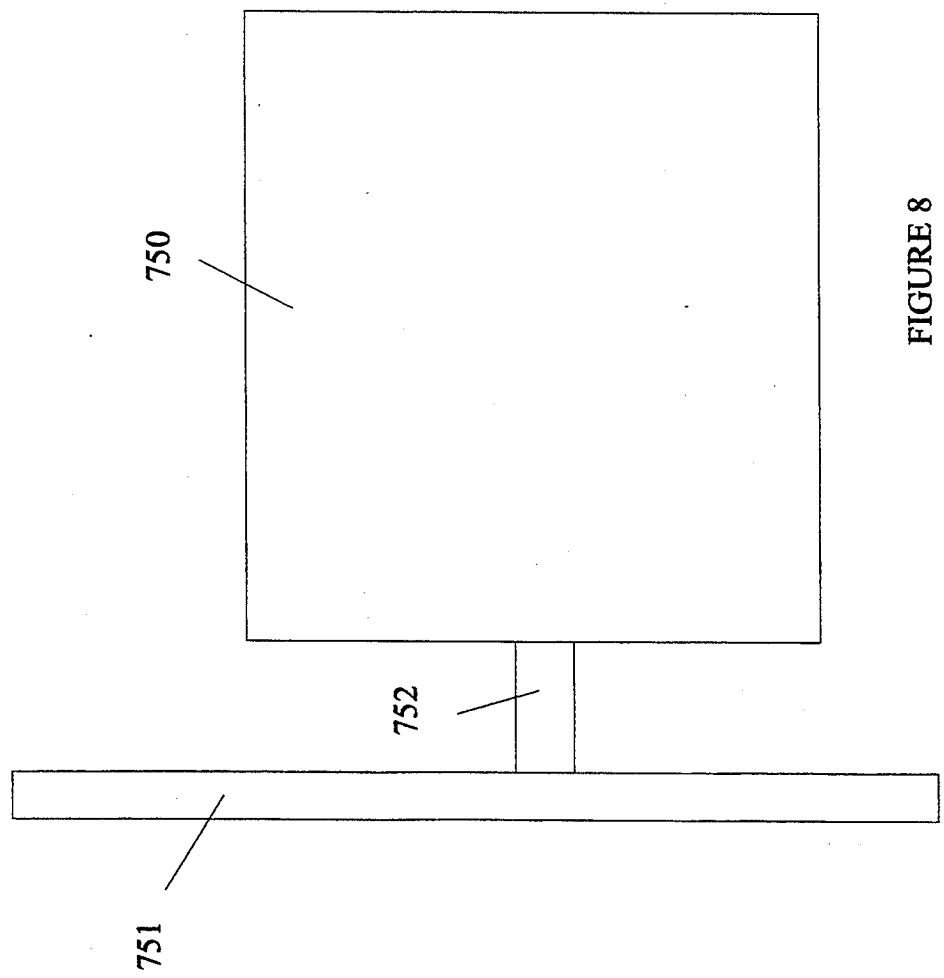
FIG. 8 is a top view of a one embodiment of a top electrode according to the present invention.

While the above embodiments of the present invention have been described in terms of removing sufficient material from the top plate of a capacitor to change its capacitance, it will be apparent to those skilled in the art that another method of changing the size of the top capacitor may also be used. For example, the top plate 750 of a capacitor can be connected to the corresponding column line 751 by a narrow bridge 752 as shown in FIG. 8. The size of the top plate can be changed by breaking the bridge connection. The break may be introduced by laser ablation of the bridge material. In this case, the bridge may be constructed from a material that is very sensitive to disruption by the laser. For example, the material may have a very low melting point or include a dye that matches the laser wavelength.

This embodiment has several advantages over removing a portion of plate 750. First, the change in capacitance is more controllable, since the change in plate area is not dependent of the amount of material removed by the laser. Second, the amount of material ablated is significantly reduced. Some of the ablated material will be deposited on the surface of the memory plane; hence, it is advantageous to reduce the amount of material ablated. Third, the amount of energy needed to break the bridge is significantly less than that required to remove a significant portion of plate 750. Finally, any potential damage to conductor 751 from the laser pulse is minimized, since the amount of energy deposited by the laser is less than that needed to disrupt the conductor. This is particularly true in the case in which the bridge is much more sensitive to the laser than conductor 751.

The bridge may also be removed electrically. For example, the laser may be replaced by a probe that can contact plate 750. If conductor 751 is grounded, a current can be run through bridge 752 which is sufficient to disrupt the bridge in a manner analogous to blowing a fuse. Similarly, an electron beam may be used to remove the bridge directly or through the application of the beam current to plate 750.

While the above-described embodiments of the present invention utilized rectangular geometries, it will be apparent to those skilled in the art that the capacitors may be arranged in any two-dimensional geometry in which the top plates are connected in groups by conductors parallel to the axis defining the first dimension and the bottom plates are connected in groups by conductors parallel to the axis defining the other dimension.

Figure 9:
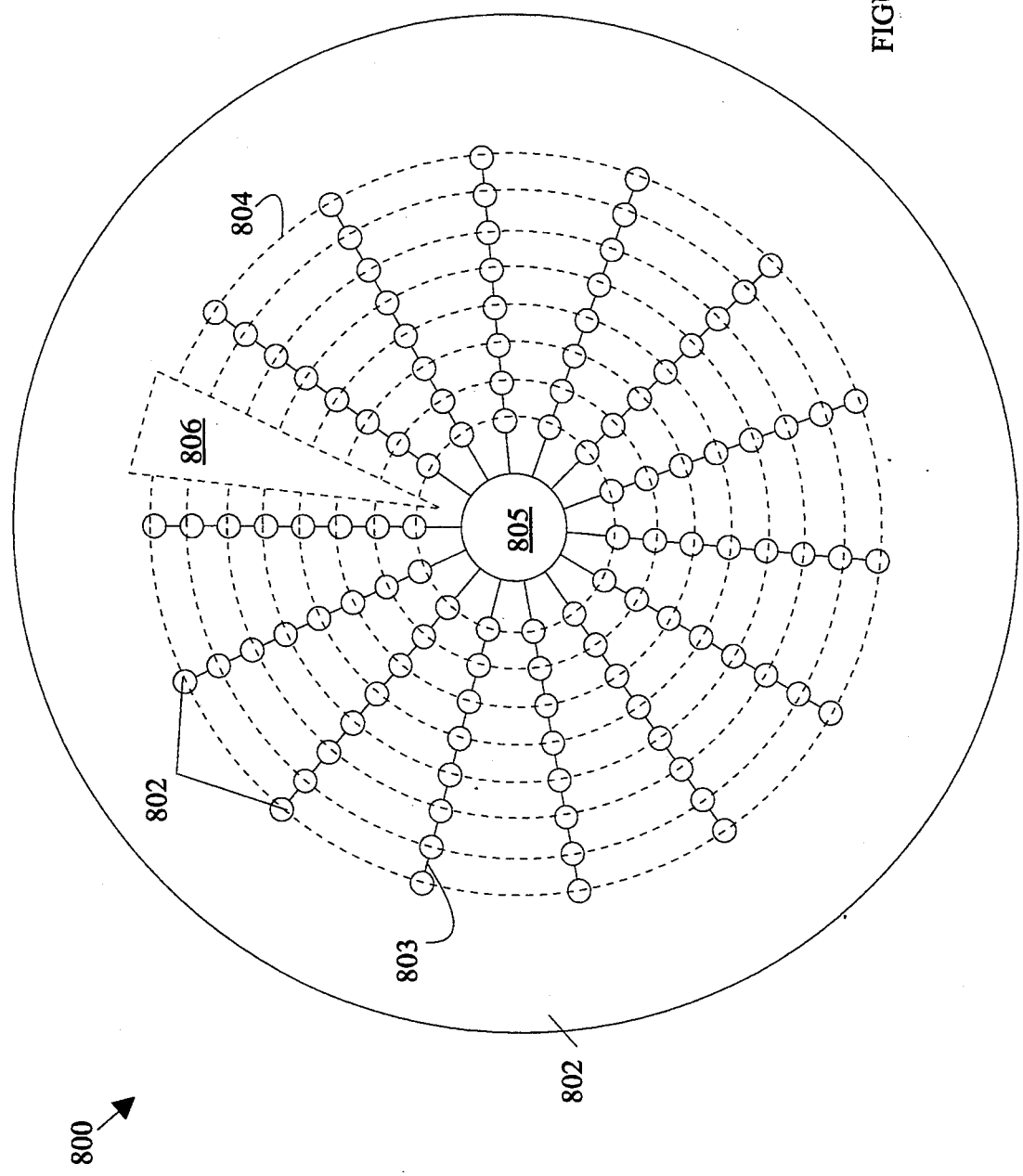
FIG. 9 is a top view of a memory plate according to the present invention in which the capacitors are organized in a polar coordinate array instead of a rectangular array.

For example, a circular geometry may be utilized as shown in FIG. 9 which is a top view of another embodiment of a memory according to the present invention. Memory 800 is constructed on a circular dielectric plate 802. The top plates of the capacitors 801 of memory 800 are connected by radial conductors of which conductor 803 is typical. The bottom plates which are not visible in the drawing are connected by circular conductors of which conductor 804 is typical. The conductors on the bottom side of dielectric plate 802 are shown in phantom. The electronics 805 and 806 for addressing the various conductors and collecting the displaced charge are located so as to intercept the relevant conductors.

The circular geometry shown in FIG. 9 is advantageous for systems in which the memory is utilized as a WORM memory and in which the data is written by directing a laser at the top electrode. In such a system, a conventional WORM drive may be used to write the data. Further, if the top electrodes are constructed from a material that has a significantly different reflectivity than that of the dielectric plate 802, the memory can be read while in the WORM drive in the conventional manner. Once the memory is completely written, it can be removed and placed in a reader for reading electrically.

To simplify the description of the present invention, the sets of conductors that are parallel to the axes of the two-dimensional coordinate system will be referred to as rows and columns. For example, in the embodiment shown in FIG. 9, the rings 804 may be viewed as being "columns" and the radial conductors 803 as being "rows".

The above-described embodiments of the present invention have utilized different plate areas on bits representing ones and zeros, respectively, to provide different capacitances corresponding to ones and zeros. However, it will be apparent to those skilled in the art that the dielectric constant of the material between any top and bottom pair may be changed to convert a one to a zero. For example, if the dielectric is PZT that has been annealed to form a peroskovite structure with a high dielectric constant, heating the dielectric locally with a laser can convert this high dielectric structure to a low dielectric structure which results in a decrease in capacitance, thus converting a one to a zero. In the case of PZT, the resulting change can be greater than a factor of 10 in the capacitance.

If the heating takes place in an oxygen atmosphere, chemical changes at the interface of the top electrode and dielectric material may also be used to alter the capacitance of the capacitor. For example, the formation of an oxide or other low dielectric material between the electrode and the dielectric converts the capacitor to a circuit that is equivalent to two series capacitors in which one of the capacitors has a low capacitance because of the low dielectric constant. Hence, the effective capacitance is substantially less than that before the heating.

While the above embodiments have been described in terms of particular functions for rows and columns, it will be apparent to those skilled in the art that the roles of the rows and columns can be interchanged without altering the functioning of the present invention. Hence, it is to be understood that the labels "row" and "column" are interchangeable.

The data storage density of a capacitor array according to the present invention is determined by the minimum capacitor size. Using PZT capacitors, capacitors as small as 2 $\mu$m $\times$ 2 $\mu$m can be sensed. Hence, the present invention can provide data densities of the same order as CD-ROMs without the long read times associated with CD-ROMs.

Various modifications to the present invention will become apparent to those skilled in the art from the foregoing description and accompanying drawings. Accordingly, the present invention is to be limited solely by the scope of the following claims.

What is claimed is:

1. A memory comprising:
   a plurality of capacitor elements organized into a two-dimensional array having a plurality of rows and columns, each said capacitor element comprising a bottom electrode, a top electrode, and a dielectric layer disposed between said top and bottom electrodes, all of said bottom electrodes in a each said column being connected together to form a column electrode and all of said top electrodes in each row being connected together to form a row electrode;
   signal generating means for generating an electrical signal on one of said row electrodes while holding the remaining said row electrodes to a reference potential; and
   sensing means for sensing the current generated in one of said column electrodes in response to the generation of said electrical signal while holding said column electrode at said reference potential, wherein the capacitance of said capacitor elements corresponds to data values stored in said memory.

2. The memory of claim 1 wherein said two-dimensional array is a rectangular array.

3. The memory of claim 1 wherein said two-dimensional array is a circular array, said rows corresponding to spokes of said circular array and said column corresponding to a plurality of circles.

4. The memory of claim 1 wherein said dielectric layer comprises PZT.

5. The memory of claim 1 wherein one of said capacitor elements has a top electrode that differs in size from one other top electrode, and wherein all of said bottom electrodes are of the same size.

6. The memory of claim 1 wherein the portion of said dielectric layer between said top and bottom electrodes of one of said capacitor elements has a different dielectric constant than the portion of said dielectric layer between said top and bottom electrodes of another of said capacitor elements.

7. The memory of claim 1 wherein said top electrodes comprise a material that may be removed by exposure to a laser beam.

8. The memory of claim 1 further comprising means for directing a laser beam at a selected one of said capacitance elements.

* * * * *